United States Patent
Male

(10) Patent No.: US 6,597,183 B1
(45) Date of Patent: Jul. 22, 2003

(54) RESISTANCE MEASUREMENT SYSTEM

(75) Inventor: Barry J. Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 10/032,641

(22) Filed: Dec. 28, 2001

(51) Int. Cl.⁷ .............................................. G01R 27/02
(52) U.S. Cl. ..................... 324/607; 324/525; 324/691
(58) Field of Search ............................ 324/607, 158.1, 324/691, 713, 522, 525, 704; 340/657, 660, 664

(56) References Cited

U.S. PATENT DOCUMENTS

| | | | | |
|---|---|---|---|---|
| 3,490,039 A | * | 1/1970 | Tsao ............................ | 324/704 |
| 3,786,350 A | * | 1/1974 | Munt .......................... | 324/712 |
| 3,876,933 A | * | 4/1975 | Herrington .................. | 324/607 |
| 3,978,402 A | * | 8/1976 | Ryder ......................... | 324/607 |
| 4,816,745 A | * | 3/1989 | Schneider ................... | 324/704 |

* cited by examiner

*Primary Examiner*—N. Le
*Assistant Examiner*—Vincent Q Nguyen
(74) *Attorney, Agent, or Firm*—W. Daniel Swayze, Jr.; W. James Brady; Frederick J. Telecky, Jr.

(57) ABSTRACT

A system is provided for precisely measuring a resistive load embedded in a potentially non-linear and capacitive Powered Device network which eliminates variable voltage from the measurement, decreases the capacitive settling times, and averages out system noise. A current and voltage (I-V) controller receives control voltages, applies constant load voltages to the resistive load in response to receiving the control voltages, and generates current flow voltages corresponding to current flowing through the resistive load. An integrating analog to digital converter (ADC) circuit receives the generated current flow voltages from the I-V controller and performs measurement cycles thereon. A control processor is operatively communicative with both the integrating ADC circuit and the I-V controller for controlling the measurements and calculations on the resistive load during first and second measurement cycles. After the second measurement cycle, the control processor calculates the resistive load value based on the difference between first and second digital output values from the ADC circuit.

5 Claims, 3 Drawing Sheets

RESISTANCE MEASUREMENT SYSTEM

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

In Power over Ethernet (POE) systems, it is desired to measure a unique resistance signature at the load to identify that a device is capable of being powered. For instance, it is typically desired to identify a resistive load placed at a Powered Device (PD) end of a cable such as a category 5 type cable. In one known technique, an applied voltage is first measured across the resistive load and then the current flowing therethrough is measured for identifying the value of the resistive load. Thereafter, the value for the resistive load is obtained by dividing the measured values of the applied voltage by the current.

However, if the resistive load is shunted by a large capacitance, then a predefined number of time constants is required as a settling time before making the DC measurements to prevent distortion by the shunt capacitance charging current and allow an accurate resistive load measurement to be performed. As a result of the settling time associated with the shunt capacitance, the time required for the resistive load measurement calculation increases. Additionally, the resistive load may appear in series with a non-linear device, such as a diode, having an offset voltage which must be subtracted to obtain an accurate resistive load measurement. The offset is typically obtained by making measurements at two different terminal voltages and then calculating the difference between the two measurements. Again, time for allowing the line capacitance to settle is required in the resistive load measurement which further increases the resistive measurement time.

As the resistive load is generally placed at the PD end of a long cable, the resistive load measurement is also susceptible to noise pickup from the cable. To minimize the effect of this noise, an averaging technique is utilized in the measurement of the applied voltage and current for obtaining the equivalent DC value of the waveform which adds more time and complexity to the measurement calculation. It is therefore desirable to provide a resistive load measuring system which reduces the time and complexity that are associated with the known systems and methods.

BRIEF SUMMARY OF THE INVENTION

The present invention provides a system for precisely measuring a resistive load embedded in a potentially non-linear and capacitive PD network which eliminates variable voltage from the measurement, decreases the capacitive settling times, and averages out system noise. The present invention is directly applicable to silicon integration and is particularly applicable to Power over Ethernet (POE) systems where the presence of a resistive signature is used to identify that a device is capable of being powered.

According to an embodiment of the present invention, a system for sensing and measuring a resistive load in a non-linear network includes a current and voltage (I-V) controller for receiving control voltages, applying constant load voltages to the resistive load in response to receiving the control voltages, and generating current flow voltages corresponding to current flowing through the resistive load. An integrating analog to digital converter (ADC) circuit receives the generated current flow voltages from the I-V controller and performs measurement cycles thereon. In each of the measurement cycles, one of the current flow voltages is integrated for a fixed time interval to generate an integrated voltage and then the one integrated voltage is de-integrated to generate a digital output value reflecting the magnitude of the current flow voltage.

A control processor is operatively communicative with both the integrating ADC circuit and the I-V controller for controlling the measurements and calculations on the resistive load. During a first measurement cycle, the control processor switches to a first control voltage for input to the I-V controller and obtains a first digital output value from the integrating ADC circuit in response to integrating a first current flow voltage from the I-V controller. After completion of the first measurement cycle, a second measurement cycle is performed wherein the control processor switches to a second control voltage for input to the I-V controller and obtains a second digital output value from the integrating ADC circuit in response to integrating a second current flow voltage from the I-V controller for the fixed time interval. After the second measurement cycle, the control processor calculates the resistive load value based on the difference between the first and second digital output values.

Other aspects, features and advantages of the present invention are disclosed in the detailed description that follows.

BRIEF DESCRIPTION OF THE SEVERAL VIEWS OF THE DRAWING

The invention will be more fully understood by reference to the following detailed description of the invention in conjunction with the drawings, of which.

DETAILED DESCRIPTION OF THE INVENTION

Figure 1:
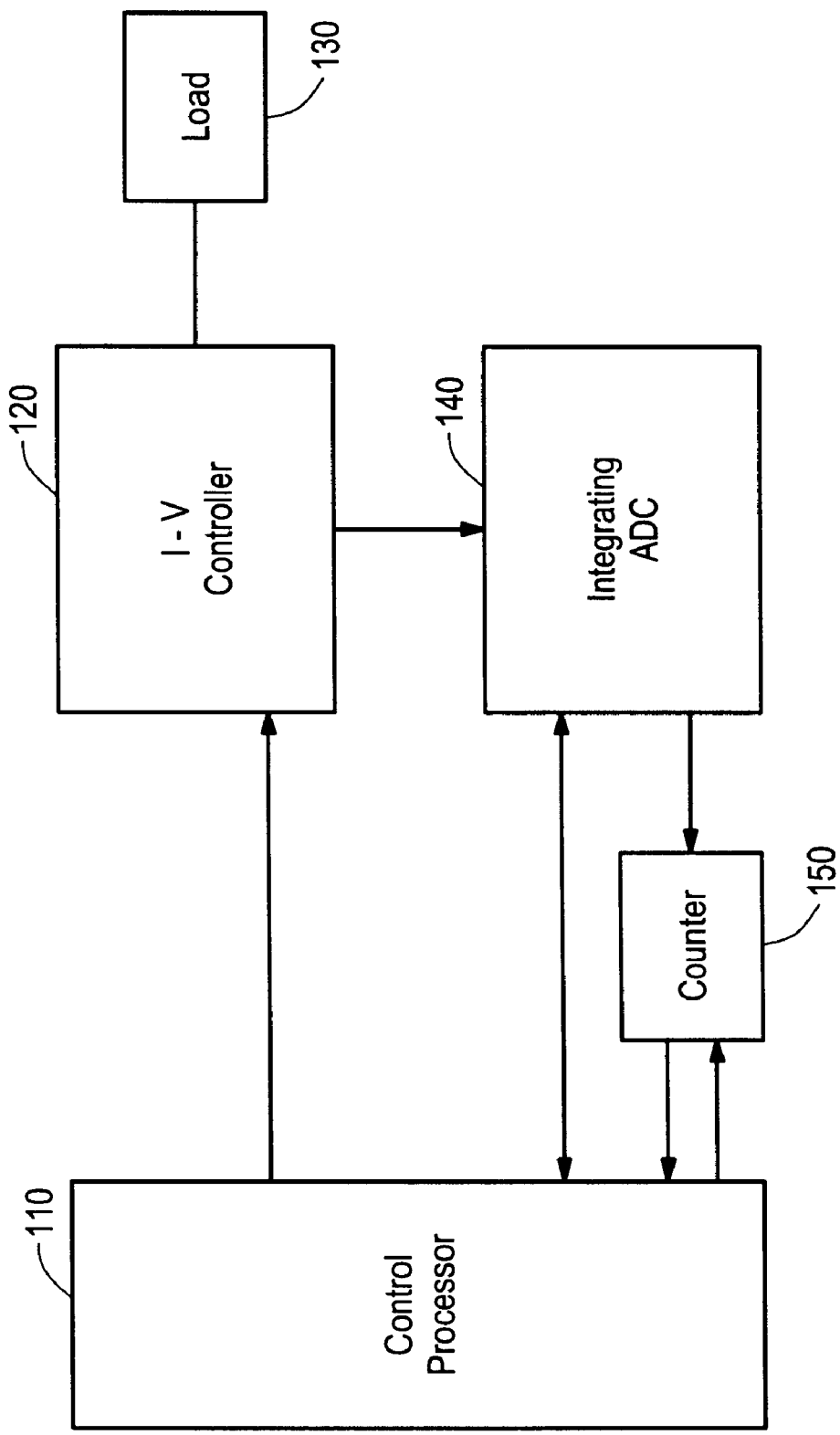
FIG. 1 illustrates a system for measuring resistance in a non-linear network according to an embodiment of the present invention.

The embodiments of the present invention are directed to a system and method for sensing and measuring resistance in a non-linear network. FIG. 1 illustrates a system for measuring resistive loads according to an embodiment of the present invention which includes a control processor 110 for performing control and measurement operations, a current-voltage (I-V) controller 120 for receiving control voltages from the control processor 110 and generating load voltages and current flow voltages in response thereto, a load 130 connected to the I-V controller 120, an integrating analog to digital converter (ADC) circuit 140 operatively communicative with the I-V controller 120 and the control processor 110 for integrating and de-integrating the current flow voltages, and a counter 150 operatively communicative with the integrating ADC circuit 140 and the control processor 110 for outputting a digital output of the integrated voltage to the control processor 110.

More specifically, the control processor 110 performs first and second measurement cycles in which first and second control voltages are sequentially generated and inputted into the I-V controller 120. During the first measurement cycle, the I-V controller 120 generates a first current flow voltage corresponding to the current flowing through the resistive load 130 in response to the first control voltage being applied to the resistive load 130. After completion of the first measurement cycle, the control processor 110 applies the second control voltage to the I-V controller 120 during the second measurement cycle wherein a second current flow voltage is generated which corresponds to the current flowing through the resistive load 130 in response to the application of the second control voltage.

Figure 3:
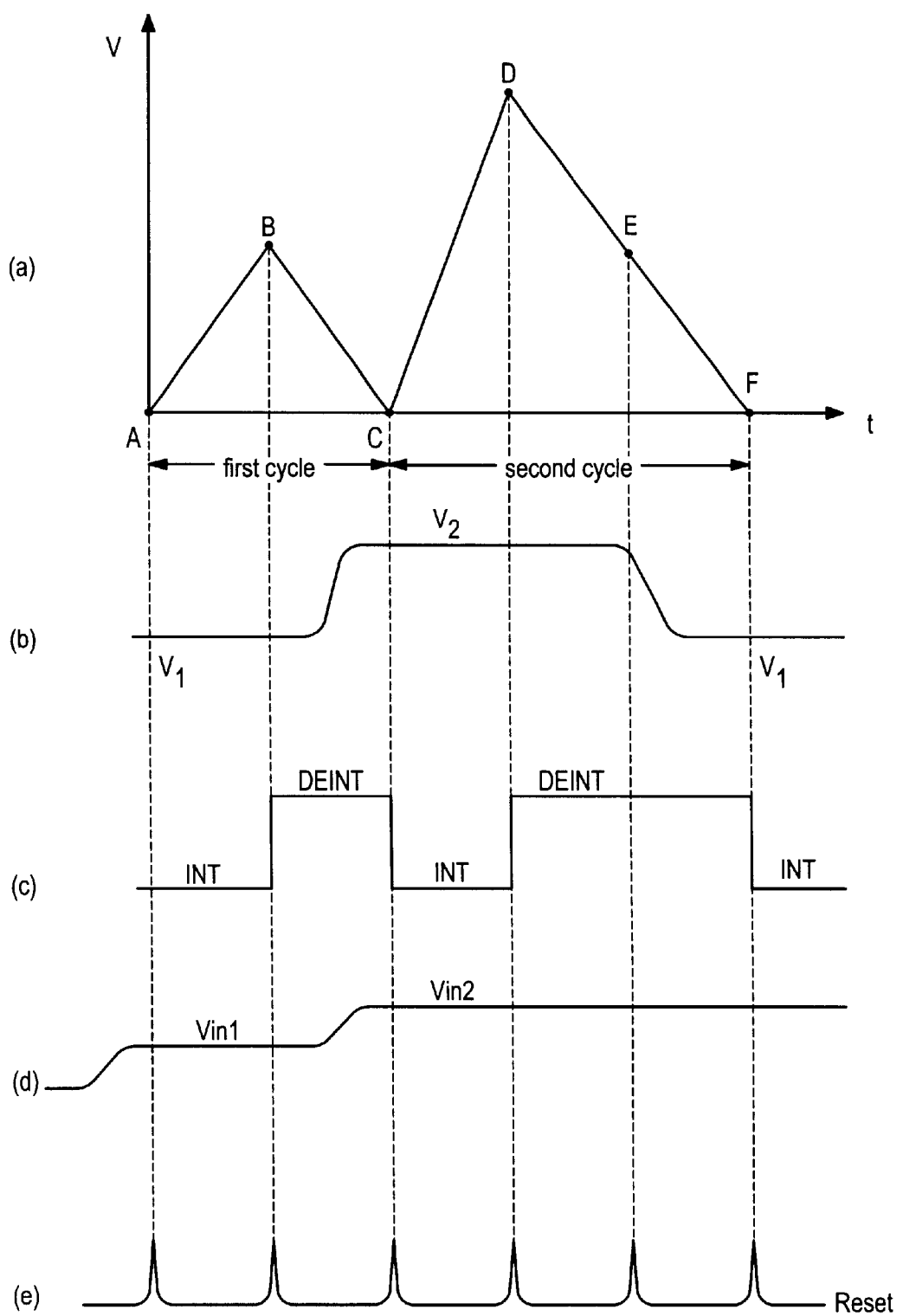
FIGS. 3(a), 3(b), 3(c), 3(d), and 3(e) are waveform diagrams of signals used in measuring resistances according to an embodiment of the present invention.

The operation of the resistive measurement system of FIG. 1 will be further described with reference to the waveform diagrams in FIGS. 3(a)–3(e). Prior to the first measurement cycle, the control processor 110 switches the I-V controller 120 to a first control voltage V1 as shown in FIG. 3(b). The first control voltage V1 is set to allow a sufficient amount of time so that the current flow voltage Vin rises to a first voltage level Vin1 before the integration phase begins at point A as shown in FIG. 3(d). During the first measurement cycle between points A and C as shown in FIG. 3(a), the first current flow voltage Vin1 corresponding to the first control voltage V1 is integrated for a fixed time interval between points A and B to generate a first integrated voltage. During the integrating phase, the control processor 110 switches the integrating ADC 140 to an integration state (INT) as shown in FIG. 3(c). Then, the first integrated voltage is de-integrated between points B and C in which the control processor 110 switches the integrating ADC 140 to a de-integrating state (DEINT).

The counter 150 is connected to the output of the integrating ADC circuit 140 and generates a digital output value reflecting the magnitude of the first integrated voltage. The digital output value is input to the control processor 110. The control processor 110 detects when a count value of the counter 150, which corresponds to the fixed time interval, is reached at point B. In response to reaching the count value, the control processor 110 generates a reset signal as shown in FIG. 3(e) that is input to the counter 150 and resets the counter 150 to zero before beginning the next count sequence. During the de-integration of the first measurement cycle, the control processor 110 switches the integrating ADC 140 to the de-integrating state DEINT at point B and further monitors the digital output value from the counter 150. At point C, when the de-integrated voltage is equivalent to the initial voltage at point A, which may be substantially 0V, the count value is saved, and the control processor 110 generates another reset signal for resetting the counter 150.

Prior to initiating the second measurement cycle and after the integration phase of the first measurement cycle is completed (sometime between points B and C), the control processor 110 switches to the second control voltage V2 and performs the second measurement cycle between points C to F. The second control voltage V2 is switched during this time to allow for a second voltage level Vin2 to reach a steady state value. The operation of the second measurement cycle is similar to the operation of the first measurement cycle. In the second measurement cycle, the control processor 110 switches the integrating ADC 140 to the integrating state INT at point C and applies the second current flow voltage. The second current flow voltage is integrated for the fixed time interval between points C and D. Then at point D, the control processor 110 generates the reset signal to reset the counter 150 and switches the integrating ADC 140 to the de-integrating state DEINT which lasts until point F.

During de-integration, the control processor 110 detects when the count value of the counter 150 is equal to the stored value from the first measured cycle, and then generates the reset signal at point E for resetting the counter 150. Thereafter, the counter 150 continues to count until the integrated voltage is equivalent to the voltage at point C, which may be substantially 0V. By the resetting operation at point E, the second measurement cycle automatically carries out a subtraction of the first current measurement in the course of performing the second current measurement. Therefore, the count value obtained at point F (for the count value between points E and F) will correspond to the value for the resistive load 130.

Figure 2:
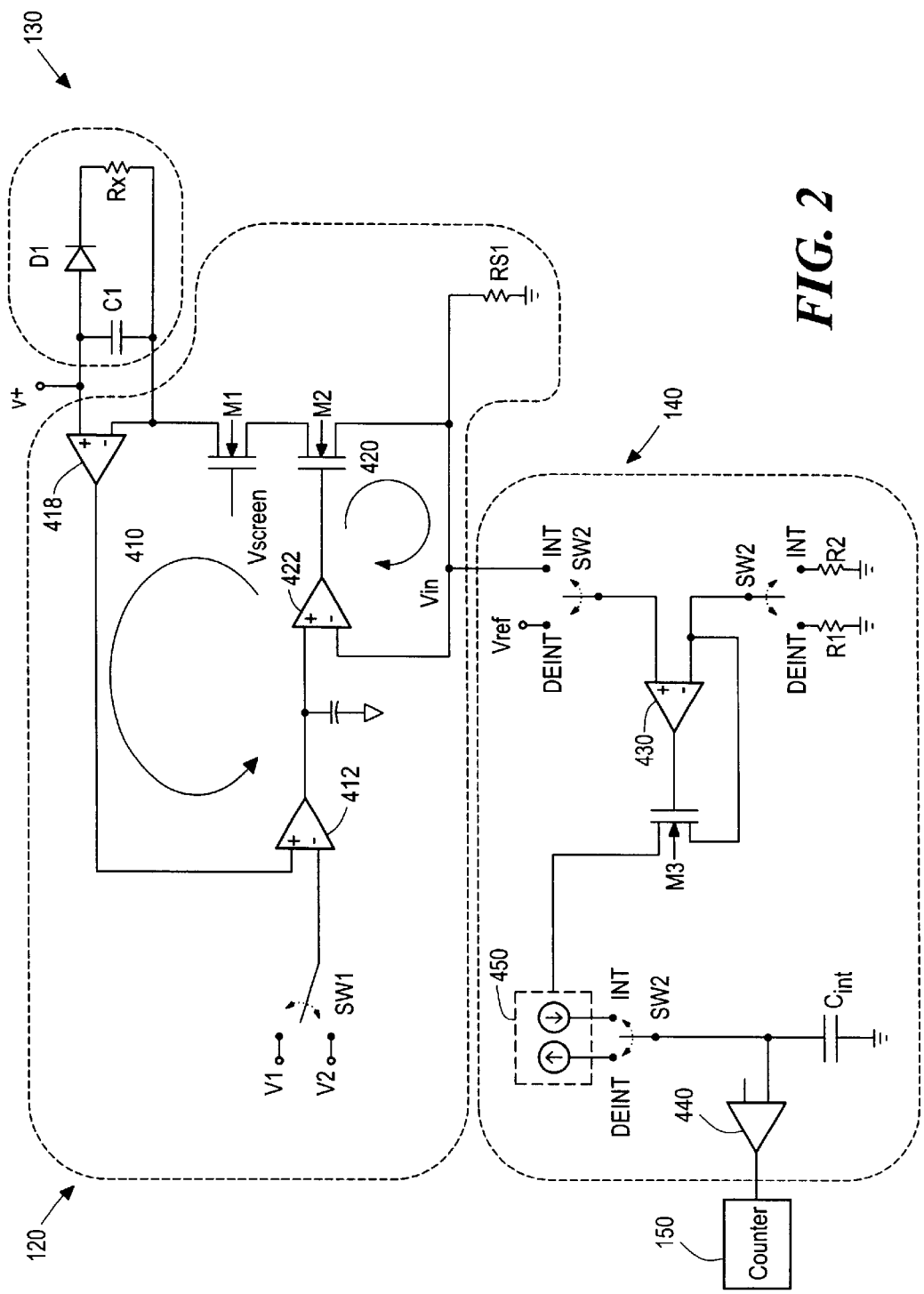
FIG. 2 is a detailed illustration of circuitry for measuring resistance in a system according to an embodiment of the present invention.

Specific circuitry used for a system in an embodiment of the present invention will be described with reference to FIG. 2. In the present embodiment, Rx is an unknown load resistance to be measured. The load resistance Rx may appear in series with one or several diodes D1. Shunt or load capacitance C1 may appear across this network. A voltage $V^+$ is applied to the network which may be +48V in one example. First and second control voltages V1 and V2 are switched by the control processor 110 and applied to a closed loop 410 during the first and second measurement cycles. For instance, the first control voltage V1 may be 0.8V and the second control voltage V2 may be 1.6V in one application of the present invention. The first and second control voltages of 0.8V and 1.6V may be obtained, for example, from a ratiometric function based on a reference voltage Vref (e.g., 5V) using a voltage divider (not shown). Thus, a ratio of Ratio3=0.16 is established when the control processor 110 switches a first switch to a V1 position and a ratio of Ratio4=0.32 is established when the control processor 110 switches the first switch to a V2 position, where V1=Vref×Ratio3 and V2=Vref×Ratio4. The voltage divider and reference voltage may be modified to obtain other desired first and second control voltages.

The present system further includes a first control loop 410 for which closure thereof is completed at the inputs of an error transconductance amplifier 412. The output of the error transconductance amplifier 412 commands a load current via a current control loop 420 which includes a differential amplifier 422 and a MOSFET M2. The current control loop 410 has enough current authority to quickly charge a load capacitance C1. The peak authority of the control loop 410 establishes a controlled dv/dt at the load terminals to limit radiated emissions during voltage switching.

The load capacitance C1 is the dominant frequency pole in the present system. A MOSFET M1 provides additional drain voltage screening in response to a voltage Vscreen input from the control processor 110 for maintaining a very high current source output impedance and improving the power supply noise rejection of the system. The voltage across the load resistance Rx is proportional to the applied control voltage in accordance with a gain of a differential amplifier 418 which provides feedback to the input of the error amplifier 412. For instance, a 0.2 gain of the differential amplifier 418 may be realized by configuring the differential amplifier 418 as a four resistor differential amplifier having a resistor ratio represented by Ratio1. Thus, for V1=0.8V, a load voltage of $V_L$=4V is provided and for V2=1.6V, a load voltage of $V_L$=8V is provided. The choice of an attenuation of 0.2 V/V allows significant voltage level shifting with its input resistors thus enabling process compatibility within high voltage systems. Other designs of the differential amplifier 418 may be used to realize other desired ratio values for Ratio1.

The steady state current of the load resistance Rx also flows through a ground-referenced sense resistor Rs1. The voltage drop Vin across resistor Rs1 (which has a resistance on the order of 320Ω in the present embodiment) is converted to a current when the control processor 110 switches a switch SW2 to an integrating position (INT). The switch SW2 connects the non-inverting input of an integrating amplifier 430 between Vin for the integrating position INT and Vref for the de-integrating position (DE-INT). When switch SW2 is in the integrating position (INT), the control processor 110 switches the switch SW2 so that a resistor R2 is connected to the inverting input of the integrating amplifier 430 and a positive current flows from a current mirror 450 so that the output of the integrating amplifier 430 connects through a MOSFET M3 to an integrating capacitor Cint and a comparator 440. When switch SW2 is in the de-integrating position (DE-INT), the control processor 110 switches the switch SW2 so that a resistor R1 is connected to the inverting input of the integrating amplifier 430 and a negative current flows from the current mirror 450. In one example of the present embodiment, the values of the resistors R1 and R2 are on the order of 100 kΩ for R1 and 25 kΩ for R2.

The current from the voltage drop Vin across the ground-reference resistor Rs1 charges the integrating capacitor Cint at a rate equal to Vin/(Cint×R2). The integrating capacitor Cint is charged for a fixed time interval corresponding to a predetermined number of periods of a clock CLK, for example 1024 counts in the counter 150. The count is started at point A in the first measurement cycle and at point C in the second measurement cycle (as shown in FIG. 3(a)) when the switch SW2 is moved to the integrating position INT. Then, after completing the integration phase at point B for the first measurement cycle or at point D for the second measurement cycle, the switch SW2 is moved to the de-integrating position DE-INT and the voltage on the integrating capacitor Cint is de-integrated until it reaches the equivalent voltage at point C in the first measurement cycle and the equivalent voltage at point F in the second measurement cycle, which may be sustantially 0V. The de-integration rate corresponds to Vref/(Cint×R1) in both the first and second measurement cycles. The current mirror 450 has a current turn-around ratio of RatioCS1, which is typically unity. For each de-integration phase, the periods of clock CLK are counted as a parameter COUNTS. A settling time is allowed prior to each integration phase. This operation results in:

COUNTS=(Vin/Vref)×(R1/R2)×RatioCS1×1024 (1)

Letting R1/R2=Ratio2 (2)

Then COUNTS=(Vin/Vref)×Ratio2×RatioCS1×1024 (3)

Note that the period of clock CLK and the value of the integrating capacitor Cint do not appear in the equation.

The choice of 1024 counts of the period of the clock CLK in this example yields an integrating time that is greater than several periods of the dominant system noise, 60 Hz for example, resulting in substantial rejection of that noise component due to averaging. If the period of the clock CLK is synchronized to the offending noise frequency, a very high noise rejection will occur.

For the non-diode case in each of the first and second measurement cycles, converting the current for the load resistance Rx to COUNTS, yields:

COUNTS=(((Vref×Ratio3/Ratio1)/Rx)×Rs1)×(Ratio2×RatioCS1)/Vref×1024 (4)

which simplifies to

COUNTS=Rs1/Rx×(Ratio3/Ratio1)×Ratio2×RatioCS1×1024 (5)

Where COUNTS can be seen to be inversely proportional to the load resistance Rx.

To remove a series offset Vd such as can be caused by diode D1, the first and second measurement cycles are performed with the switch SW1 first in the V1 position during the first measurement cycle and then in the V2 position during the second measurement cycle. The difference between COUNTS measured in the first and second measurement cyclces then yields:

DELTACOUNTS=((((Ratio4/Ratio1)−Vd/Vref)/Rx)×Rs1)×(Ratio2×RatioCS1)×1024−((((Ratio3/Ratio1)−Vd/Vref)/Rx×Rs1)×(Ratio2×RatioCS1)×1024 (6)

which simplifies to

DELTACOUNTS=(Rs1/Rx×Ratio4/Ratio1)−Vd/Vref×Rs1/Rx(Rs1/Rx−(Rs1/Rx×Ratio3/Ratio1)+Vd/Vref×Rs1/Rx)×Ratio2×RatioCS1×1024 (7)

which further simplifies to

DELTACOUNTS=Rs1/Rx×(Ratio4−Ratio3)×Ratio2×RatioCS1×1024 (8)

This assumes that, to a first order, the offset Vd is constant. Note again that DELTACOUNTS is inversely proportional to the load resistance Rx. Once DELTACOUNTS is obtained after the second measurement cycle, the load resistance Rx can be solved from equation (8). If the above technique of resetting the counter 150 at point E is employed, DELTACOUNTS is automatically stored in the counter 150 at point F to provide the value corresponding to the load resistance Rx. Alternatively, an explicit subtraction can be performed between the DELTACOUNTS obtained during the first and second measurement cycles.

The system according to the present embodiment applies control voltages and performs measurement cycles, which are to a first order and dependent only upon the ratio of resistors and counts but are not dependent upon the absolute value of any one device. Within linear integrated circuits, component matching is extremely well controlled in contrast to absolute matching which is very poorly controlled. As such, a so called "ratiometric technique" is utilized that can be integrated at high accuracy without the need to trim absolutes according to the present invention.

In the embodiments of the present invention, the voltage variable is eliminated from the current and voltage calculation with the voltage being held constant. Other approaches typically apply a series resistance in the positive supply lead to the unknown load resistance, and thereby require a measurement of voltage and current to calculate resistance. As a result, the present invention eliminates this requirement.

Fast settling times are obtained for capacitive shunt loads in the present invention. The current control loop 420 quickly charges the shunt capacitance and controls maximum load dv/dt to minimize radiated emissions. In contrast, other approaches typically rely on a fixed low value current source or a series resistance which results in long settling times.

An integrating converter is used in the present invention for averaging system noise while other approaches typically use single point measurements and direct voltage comparisons without any noise averaging. High accuracy based on ratios of internal devices is also achieved without trim in the present invention while other approaches often require trim. As a result, the present invention utilizes techniques that result in higher measurement accuracy in less time with a lower relative die cost.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A system for sensing and measuring a resistive load in a non-linear network, comprising:

a current and voltage (I-V) controller for receiving control voltages, applying constant load voltages to the resistive load in response thereto, and generating current flow voltages corresponding to current flowing through the resistive load;

an integrating analog to digital converter (ADC) circuit operatively communicative with said I-V controller for performing measurement cycles, said measurement cycles include integrating one of said current flow voltages from said I-V controller for a fixed time interval to generate an integrated voltage and then de-integrating said one integrated voltage to generate a digital output value reflecting the magnitude of said one current flow voltage; and a control processor operatively communicative with said integrating ADC circuit and said I-V controller for switching to a first control voltage in a first measurement cycle for input to said I-V controller and obtaining a first digital output value from said integrating ADC circuit in response to integrating a first current flow voltage from said I-V controller, then switching to a second control voltage in a second measurement cycle for input to said I-V controller and obtaining a second digital output value from said integrating ADC circuit in response to integrating a second current flow voltage from said I-V controller, and calculating a value for the resistive load after said second measurement cycle based on said first and second digital output values.

2. A system according to claim 1, wherein said I-V controller comprises a voltage control loop for holding constant the load voltages applied to the resistive load, and a current control loop for initially charging a load capacitance and thereafter enabling substantially constant load currents and corresponding current flow voltages.

3. The system according to claim 1, wherein said control processor switches said integrating ADC circuit (to an integrating state for integrating one of said current flow voltages from an initial voltage during said fixed time interval and then to a de-integrating state until the integrated voltage reaches said initial voltage.

4. The system according to claim 3, wherein said ADC circuit further comprises a counter operatively communicative with said control processor for counting to a count value, which corresponds to said fixed time interval, and is reset after said count value is reached and after the integrated voltage reaches said initial voltage.

5. The system according to claim 3, wherein said initial voltage is substantially 0V.

* * * * *